United States Patent
Seo et al.

(10) Patent No.: US 7,957,823 B2
(45) Date of Patent: Jun. 7, 2011

(54) APPARATUS AND METHOD FOR TUNING VOLUME OF DOWNLOADED SOUND

(75) Inventors: Chong-Hwa Seo, Seongnam-si (KR); Jae-Min Lee, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 759 days.

(21) Appl. No.: 11/264,181

(22) Filed: Nov. 1, 2005

(65) Prior Publication Data

US 2006/0116779 A1    Jun. 1, 2006

(30) Foreign Application Priority Data

Nov. 1, 2004  (KR) ........................ 10-2004-0087956

(51) Int. Cl.
  *G06F 17/00* (2006.01)
(52) U.S. Cl. ........................................... 700/94
(58) Field of Classification Search ............ 700/94
  See application file for complete search history.

(56) References Cited

U.S. PATENT DOCUMENTS

| | | | |
|---|---|---|---|
| 5,467,393 A * | 11/1995 | Rasmusson | 379/388.01 |
| 5,530,761 A * | 6/1996 | d'Alayer de Costemore d'Arc | 381/57 |
| 5,548,650 A * | 8/1996 | Clark | 381/55 |
| 6,011,853 A * | 1/2000 | Koski et al. | 381/56 |
| 6,201,873 B1 * | 3/2001 | Dal Farra | 381/100 |
| 6,349,285 B1 * | 2/2002 | Liu et al. | 704/500 |
| 6,760,635 B1 * | 7/2004 | Bates et al. | 700/94 |
| 6,999,591 B2 * | 2/2006 | Fado et al. | 381/58 |
| 7,095,819 B2 * | 8/2006 | Bellaouar et al. | 375/376 |
| 7,158,643 B2 * | 1/2007 | Lavoie et al. | 381/58 |
| 7,190,292 B2 * | 3/2007 | Bizjak | 341/139 |
| 7,302,062 B2 * | 11/2007 | Christoph | 381/57 |
| 7,330,395 B2 * | 2/2008 | Ichijo | 367/13 |
| 7,362,871 B2 * | 4/2008 | Inagaki | 381/55 |
| 7,602,923 B2 * | 10/2009 | Lee et al. | 381/59 |
| 2001/0016048 A1 * | 8/2001 | Rapeli | 381/106 |
| 2002/0051546 A1 * | 5/2002 | Bizjak | 381/106 |
| 2002/0067835 A1 * | 6/2002 | Vatter | 381/58 |
| 2003/0083024 A1 * | 5/2003 | Richenstein et al. | 455/99 |
| 2003/0152240 A1 * | 8/2003 | Resnick | 381/73.1 |
| 2004/0078104 A1 * | 4/2004 | Nguyen et al. | 700/94 |
| 2004/0247136 A1 * | 12/2004 | Wallace | 381/56 |
| 2005/0047605 A1 * | 3/2005 | Lee et al. | 381/56 |
| 2005/0175190 A1 * | 8/2005 | Tashev et al. | 381/92 |

FOREIGN PATENT DOCUMENTS

KR    10-2004-0021119    3/2004

* cited by examiner

*Primary Examiner* — Curtis Kuntz
*Assistant Examiner* — Paul McCord
(74) *Attorney, Agent, or Firm* — The Farrell Law Firm P.C.

(57) ABSTRACT

An apparatus and method for tuning the volume of a sound downloaded from an outside source in a device for outputting such a sound through a speaker are provided. The apparatus includes a memory, a speaker, a microphone, a codec, a volume tuning determining unit, and a volume tuner. The memory stores a sound signal downloaded from the outside source. The speaker outputs the sound signal stored in the memory. The microphone receives the sound signal output from the speaker. The codec outputs modulation data of the sound signal input from the microphone. The volume tuning determining unit calculates volume figure data with respect to the sound signal, stress figure data of the speaker, and volume adjustment gain data using the modulation data. The volume tuner tunes the volume of the sound signal using the calculated volume adjustment gain data.

8 Claims, 9 Drawing Sheets

| MELODY | Gain | VOLUME | FoV | 10log(FoV) | FoVc |
|---|---|---|---|---|---|
| 8 DEFAULT RING TONES | 0x1d | 64 | 157 | 21.959 | 62.7 |
| | 0x1e | 65 | 222 | 23.46353 | 64.2 |
| | 0x1d | 67 | 395 | 25.96597 | 66.7 |
| | 0x1c | 66 | 261 | 24.16641 | 64.9 |
| | 0x1c | 67 | 373 | 25.71709 | 66.4 |
| | 0x1f | 67 | 663 | 28.21514 | 68.9 |
| | 0x1c | 64 | 152 | 21.81844 | 62.5 |
| | 0x1d | 64 | 136 | 21.33539 | 62.0 |
| 8 ANYCALL. POLYPHONIC RING TONES | 0x1c | 69 | 669 | 28.25426 | 69.0 |
| | 0x1a | 70 | 670 | 28.26075 | 69.0 |
| | 0x1b | 67 | 494 | 26.93727 | 67.6 |
| | 0x1d | 72 | 1115 | 30.47275 | 71.2 |
| | 0x1d | 67 | 567 | 27.53583 | 68.2 |
| | 0x18 | 73 | 1204 | 30.80626 | 71.5 |
| | 0x1b | 67 | 670 | 28.26075 | 69.0 |
| | 0x19 | 72 | 1090 | 30.37426 | 71.1 |
| 7 MOODY MELODIES | 0x1d | 66 | 359 | 25.55094 | 66.3 |
| | 0x1a | 68 | 665 | 28.22822 | 68.9 |
| | 0x1a | 64 | 150 | 21.76091 | 62.5 |
| | 0x1a | 65 | 229 | 23.59835 | 64.3 |
| | 0x1c | 65 | 292 | 24.65383 | 65.4 |
| | 0x1b | 64 | 237 | 23.74748 | 64.4 |
| | 0x1c | 64 | 307 | 24.87138 | 65.6 |
| 14 EXCITING MELODIES | 0x1b | 66 | 315 | 24.98311 | 65.7 |
| | 0x1d | 66 | 510 | 27.0757 | 67.8 |
| | 0x1b | 64 | 248 | 23.94452 | 64.6 |
| | 0x1c | 67 | 453 | 26.56098 | 67.3 |
| | 0x1d | 66 | 309 | 24.89958 | 65.6 |
| | 0x1b | 64 | 256 | 24.0824 | 64.8 |
| | 0x1b | 65 | 403 | 26.05305 | 66.8 |
| | 0x1c | 64 | 169 | 22.27887 | 63.0 |
| | 0x18 | 66 | 306 | 24.85721 | 65.6 |
| | 0x19 | 67 | 364 | 25.61101 | 66.3 |
| | 0x1d | 68 | 660 | 28.19544 | 68.9 |
| | 0x1a | 64 | 281 | 24.48706 | 65.2 |
| | 0x1a | 68 | 401 | 26.03144 | 66.7 |
| | 0x1b | 65 | 385 | 25.85461 | 66.6 |
| 8 CLASSIC MELODIES | 0x1c | 68 | 671 | 28.26723 | 69.0 |
| | 0x1c | 69 | 670 | 28.26075 | 69.0 |
| | 0x1c | 61 | 110 | 20.41393 | 61.1 |
| | 0x1d | 65 | 257 | 24.09933 | 64.8 |
| | 0x1d | 65 | 391 | 25.92177 | 66.6 |
| | 0x1c | 64 | 260 | 24.14973 | 64.8 |
| | 0x1c | 65 | 257 | 24.09933 | 64.8 |
| | 0x1c | 65 | 372 | 25.70543 | 66.4 |

| N | freq | loss[dB] | power compensation [real] |
|---|---|---|---|
| 32 | 50 | −17.3 | 53.7 |
| 30 | 53 | −17.2 | 52.5 |
| 28 | 57 | −17.1 | 51.3 |
| 26 | 62 | −17 | 50.1 |
| 24 | 67 | −16.9 | 49.0 |
| 22 | 73 | −16.8 | 47.9 |
| 20 | 80 | −16.7 | 46.8 |
| 18 | 89 | −16.6 | 45.7 |
| 16 | 100 | −16.5 | 44.7 |
| 14 | 114 | −16.3 | 42.7 |
| 12 | 133 | −16.1 | 40.7 |
| 10 | 160 | −15.5 | 35.5 |
| 8 | 200 | −14.5 | 28.2 |
| 6 | 267 | −12 | 15.8 |
| 4 | 400 | −8.5 | 7.1 |
| 2 | 800 | 0 | 1.0 |

FIG.7

| MELODY | Gain | FoS | sqrt(Fos) | stress | FoSc |
|---|---|---|---|---|---|
| 8 DEFAULT RING TONES | 0x1d | 61 | 7.8 | 1.73 | 1.65 |
| | 0x1e | 99 | 9.9 | 1.92 | 2.10 |
| | 0x1d | 42 | 6.5 | 1.31 | 1.37 |
| | 0x1c | 44 | 6.6 | 1.69 | 1.40 |
| | 0x1c | 66 | 8.1 | 1.82 | 1.72 |
| | 0x1f | 85 | 9.2 | 1.84 | 1.95 |
| | 0x1c | 84 | 9.2 | 1.92 | 1.94 |
| | 0x1d | 54 | 7.3 | 1.63 | 1.55 |
| 8 ANYCALL POLYPHONIC RING TONES | 0x1c | 56 | 7.5 | 1.57 | 1.58 |
| | 0x1a | 65 | 8.1 | 1.72 | 1.70 |
| | 0x1b | 72 | 8.5 | 1.7 | 1.79 |
| | 0x1d | 88 | 9.4 | 1.94 | 1.98 |
| | 0x1d | 76 | 8.7 | 1.84 | 1.84 |
| | 0x18 | 48 | 6.9 | 1.34 | 1.46 |
| | 0x1b | 95 | 9.7 | 1.91 | 2.06 |
| | 0x19 | 44 | 6.6 | 1.36 | 1.40 |
| 7 MOODY MELODIES | 0x1d | 77 | 8.8 | 1.81 | 1.86 |
| | 0x1a | 40 | 6.3 | 1.37 | 1.34 |
| | 0x1a | 45 | 6.7 | 1.47 | 1.42 |
| | 0x1a | 64 | 8.0 | 1.65 | 1.69 |
| | 0x1c | 66 | 8.1 | 1.76 | 1.72 |
| | 0x1b | 67 | 8.2 | 1.69 | 1.73 |
| | 0x1c | 77 | 8.8 | 1.83 | 1.86 |
| 14 EXCITING MELODIES | 0x1b | 77 | 8.8 | 1.82 | 1.86 |
| | 0x1d | 78 | 8.8 | 1.89 | 1.87 |
| | 0x1b | 70 | 8.4 | 1.77 | 1.77 |
| | 0x1c | 82 | 9.1 | 1.95 | 1.91 |
| | 0x1d | 94 | 9.7 | 2.04 | 2.05 |
| | 0x1b | 62 | 7.9 | 1.71 | 1.66 |
| | 0x1b | 70 | 8.4 | 1.78 | 1.77 |
| | 0x1c | 78 | 8.8 | 1.97 | 1.87 |
| | 0x18 | 31 | 5.6 | 1.11 | 1.18 |
| | 0x19 | 62 | 7.9 | 1.7 | 1.66 |
| | 0x1d | 90 | 9.5 | 2.03 | 2.01 |
| | 0x1a | 65 | 8.1 | 1.67 | 1.70 |
| | 0x1a | 63 | 7.9 | 1.67 | 1.68 |
| | 0x1b | 77 | 8.8 | 1.82 | 1.86 |
| 8 CLASSIC MELODIES | 0x1c | 49 | 7.0 | 1.51 | 1.48 |
| | 0x1c | 73 | 8.5 | 1.83 | 1.81 |
| | 0x1c | 72 | 8.5 | 1.81 | 1.79 |
| | 0x1d | 41 | 6.4 | 1.41 | 1.35 |
| | 0x1d | 77 | 8.8 | 1.85 | 1.86 |
| | 0x1c | 62 | 7.9 | 1.69 | 1.66 |
| | 0x1c | 59 | 7.7 | 1.63 | 1.62 |
| | 0x1c | 37 | 6.1 | 1.26 | 1.29 |

APPARATUS AND METHOD FOR TUNING VOLUME OF DOWNLOADED SOUND

PRIORITY

This application claims priority under 35 U.S.C. §119 to an application entitled "Apparatus and Method for Tuning Volume of Sound Downloaded from Outside Sources" filed in the Korean Intellectual Property Office on Nov. 1, 2004 and assigned Serial No. 2004-87956, the contents of which are incorporated herein by reference.

BACKGROUND OF THE INVENTION

1. Field of the Invention

The present invention generally relates to an apparatus and method for tuning the volume of sound downloaded from outside sources, and in particular, to an apparatus and method for tuning the volume of downloaded sound, in which, in a device for outputting downloaded sound through a speaker, the volume of the downloaded sound is tuned based on the stress ratio of the speaker.

2. Description of the Related Art

A mobile phone is a device that includes a speaker which may be used to output sound downloaded from an outside source. For example, a mobile phone can download a ring tone, a music file, a moving picture, or a game in a wired or wireless manner and outputs the downloaded ring tone through a speaker upon reception of a call, outputs the sound of the downloaded music file or moving picture through the speaker, or outputs the sound of the downloaded game when the downloaded game is played. A ring tone download function is representative of many multimedia functions of a mobile phone. The maximum volume of a ring tone is prescribed not to exceed a national standard level of 70 dBSPL. When a mobile phone is offered on sale on the market, sound sources that are previously loaded in the mobile phone and their volumes are adapted to such a standard. However, since the maximum volume of a ring tone downloaded by a user of a mobile phone is arbitrarily set by a service operator who provides a ring tone download service, the mobile phone cannot predict the volume of the downloaded ring tone. Thus, conventionally, after ring tones are downloaded from mobile phone manufactures, the user of the mobile phone selects one of the downloaded ring tones and determines the maximum volume of the selected ring tone as the maximum volumes of the total downloaded ring tones.

A factor that determines the maximum volume of a ring tone also includes the stress ratio of a speaker. This is because the output volume of a sound affects the life span of the speaker. The stress ratio of the speaker is a ratio of a root mean square of a voltage applied to the speaker to a rated voltage the speaker can tolerate. Generally, the stress ratio of the speaker is maintained constant for the life span of the speaker.

Since the maximum volume of unknown ring tones should be set to a representative value according to the volume of the ring tones and the stress ratio of the speaker, the volume of downloaded ring tones are generally lower than those of ring tones that are previously loaded in a mobile phone.

However, since the maximum volume of downloaded ring tones is set to a representative value, when many ring tones are downloaded, deviations among the volume of the downloaded ring tones are large. Such deviations range from 60 dBSPL to 70 dBSPL. Since a deviation of 10 dBSPL means a difference of 10 times in sound volume, deviations of 60-70 dBSPL indicate very large differences. Ring tones may be determined to be capable of being set higher after the stress ratio of a speaker is measured, but the maximum volume of downloaded ring tones is fixed to a specific value, resulting in degradation in efficiency.

Such a problem commonly occurs in not only a mobile phone but also in any device for outputting a sound including music downloaded from the outside through a speaker.

SUMMARY OF THE INVENTION

It is, therefore, an object of the present invention to provide an apparatus and method for tuning the volume of a sound downloaded from an outside source by calculating a value that is proportional to the volume of the downloaded sound and the stress ratio of a speaker.

To achieve the above and other objects, there is provided an apparatus for tuning a volume of a sound downloaded from an outside source. The apparatus includes a memory, a speaker, a microphone, a codec, a volume tuning determining unit, and a volume tuner. The memory stores a sound signal downloaded from the outside source. The speaker outputs the sound signal stored in the memory. The microphone receives the sound signal output from the speaker. The codec outputs modulation data of the sound signal input from the microphone. The volume tuning determining unit calculates volume figure data with respect to the sound signal, stress figure data of the speaker, and volume adjustment gain data using the modulation data. The volume tuner tunes the volume of the sound signal using the calculated volume adjustment gain data.

The volume tuning determining unit stores the volume-tuned sound signal in the memory, compares the calculated volume figure data and the calculated stress figure data with corresponding minimum values and corresponding maximum values, respectively, to calculate the volume adjustment gain data, and calculates the volume adjustment gain data within a predetermined range of the stress ratio of the speaker.

To achieve the above and other objects, there is also provided a method for tuning the volume of a sound downloaded from an outside source in a device having a speaker that outputs the sound and a microphone. The method includes receiving a sound signal output from the speaker through the microphone, calculating volume figure data with respect to the sound signal received through the microphone and stress figure data of the speaker, comparing the calculated volume figure data and the calculated stress figure data with corresponding reference values to calculate volume adjustment gain data for the sound signal, and tuning the volume of the sound signal using the calculated volume adjustment gain data.

The step of calculating the volume adjustment gain includes calculating a volume gain to be tuned up when the calculated volume figure data is lower than the minimum value for the volume and the calculated stress figure data is smaller than the minimum value for the stress ratio and calculating a volume gain to be tuned down when the calculated volume figure data is higher than the maximum value for the volume and the calculated stress figure data is larger than the maximum value for the stress ratio.

The step of calculating the volume adjustment gain data includes calculating a volume gain to be tuned up using the calculated stress figure data and the minimum value for the stress ratio and calculating a volume gain to be tuned down using the calculated stress figure data and the maximum value for the stress ratio.

The step of calculating the volume figure data with respect to the sound signal and the stress figure data of the speaker includes creating modulation data from the sound signal received through the microphone. The step of calculating the volume adjustment gain data includes calculating the volume adjustment gain data within a predetermined range in which the stress ratio of the speaker does not fall beyond the reference values.

To achieve the above and other objects, there is also provided a method for tuning the volume of a device having a speaker that outputs a sound signal downloaded from an outside source and a microphone. The method includes receiving a sound signal output from the speaker through the microphone, calculating volume figure data with respect to the sound signal received through the microphone and stress figure data of the speaker, comparing the calculated stress figure data with reference values to calculate volume adjustment gain data for the sound signal, and tuning the volume of the sound signal using the calculated volume adjustment gain data. Here, the step of calculating the volume adjustment gain data includes comparing the calculated volume figure data with reference values, and the reference values includes a maximum value and a minimum value.

The step of calculating the volume adjustment gain includes calculating a volume gain to be tuned up when the calculated stress figure data is smaller than the minimum value for the stress ratio and calculating a volume gain to be tuned down when the calculated stress figure data is larger than the maximum value for the stress ratio.

The step of calculating the volume adjustment gain data includes calculating a volume gain to be tuned up using the calculated stress figure data and the minimum value for the stress ratio and calculating a volume gain to be tuned down using the calculated stress figure data and the maximum value for the stress ratio.

BRIEF DESCRIPTION OF THE DRAWINGS

The above and other objects, features and advantages of the present invention will become more apparent from the following detailed description when taken in conjunction with the accompanying drawings in which:

FIG. 6 is a graph showing the frequency characteristic of a;

DETAILED DESCRIPTION OF THE PREFERRED EMBODIMENT

A preferred embodiment of the present invention will now be described in detail with reference to the annexed drawings.

Figure 1:
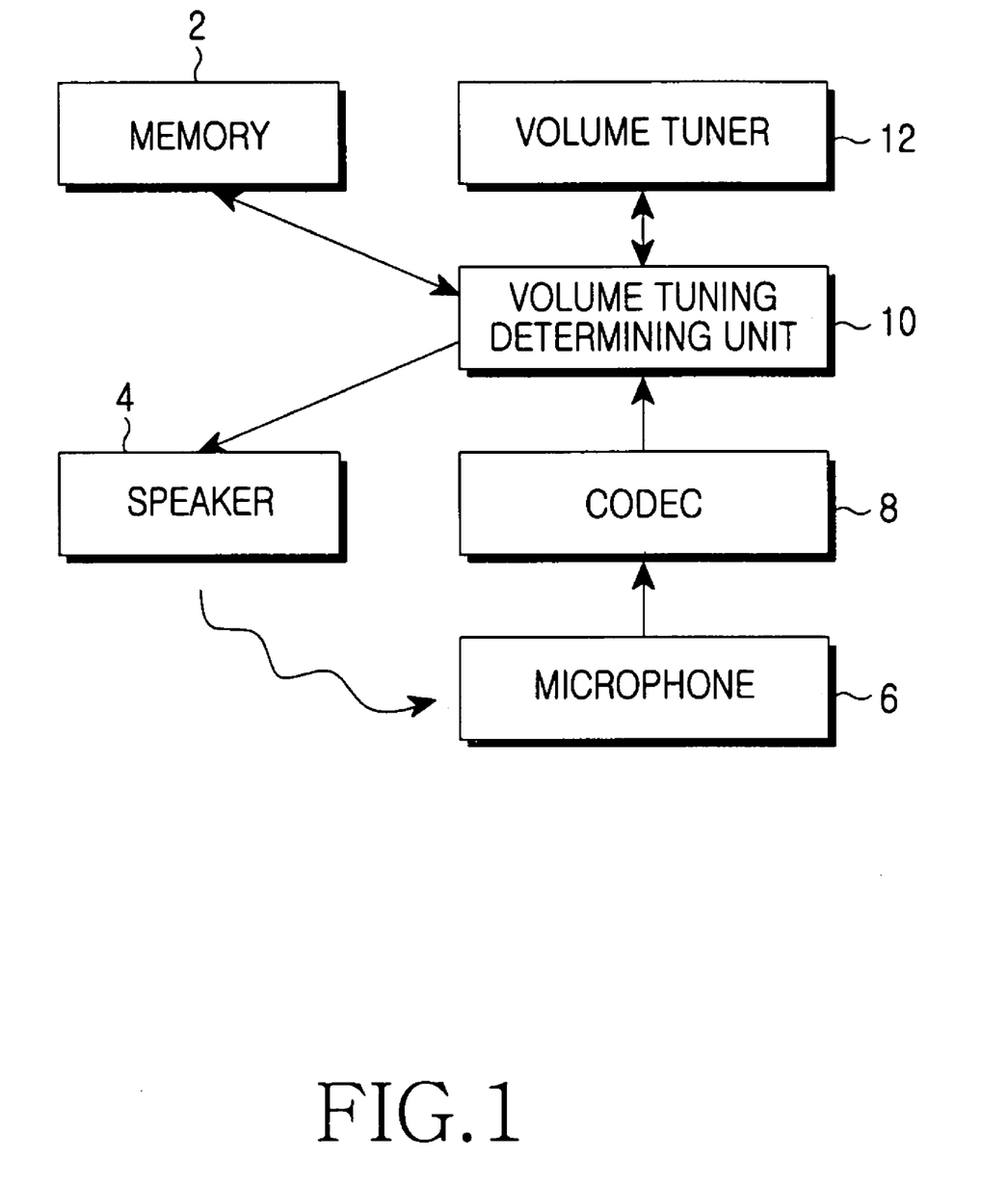
FIG. 1 is a block diagram of an apparatus for tuning the volume of a sound downloaded from an outside source according to the present invention.

FIG. 1 is a block diagram of an apparatus for tuning the volume of a sound downloaded from an outside source according to the present invention. Referring to FIG. 1, the apparatus includes a memory 2, a speaker 4, a microphone 6, a codec 8, a volume tuning determining unit 10, and a volume tuner 12. The memory 2 stores a sound downloaded from the outside source and additional information required for sound volume tuning. The speaker 4 outputs a sound stored in the memory 2.

The microphone 6 receives a sound signal output from the speaker 4 and transmits the received sound signal to the codec 8. The codec 8 samples the received sound signal to output Pulse Code Modulation (PCM) data. At this time, data transmitted from the microphone 6 to the codec 8 is a value corresponding to a voltage of the received sound signal.

The volume tuning determining unit 10 obtains a Figure of Volume (FoV) of a sound and a Figure of Stress (FoS) of the speaker 4 using the PCM data output from the codec 8 and determines a volume adjustment gain (GainAdj) using the FoV and FoS. The volume tuner 12 tunes the volume of a sound stored in the memory 2 using the volume adjustment gain (GainAdj).

The volume tuning determining unit 10 is connected to the memory 2, the speaker 4, the codec 8, and the volume tuner 12 to control their operations and also controls an interface with a user when necessary. More specifically, the volume tuning determining unit 10 determines a sound whose volume is to be tuned, controls the sound output from the memory 2 to the speaker 4, and transmits the determined volume adjustment gain (GainAdj) to the volume tuner 12 to cause the volume of the sound to be tuned by the volume tuner 12 and then stored in the memory 2. It is preferable that the volume tuning determining unit 10 asks a user whether to tune the volume of a sound if the sound is downloaded from an outside service, informs the user of whether volume tuning is available, or asks the user whether to perform volume tuning if volume tuning is available. The volume tuning determining unit 10 then transmits user input information to a corresponding component. A more detailed description will be made below.

Volume tuning may be performed every time a sound is downloaded from an outside source or may be performed for several downloaded sounds after a predetermined time has passed. A time for volume tuning may be arbitrarily set at the time of release (e.g., a predetermined time set when a product is released such as, for example, the first day of every month or every Monday, etc.) or be controlled by a user. Preferably, the volume tuning determining unit 10 controls information about the time for volume tuning. It is also preferable that volume tuning is performed for each downloaded sound.

Figure 2:
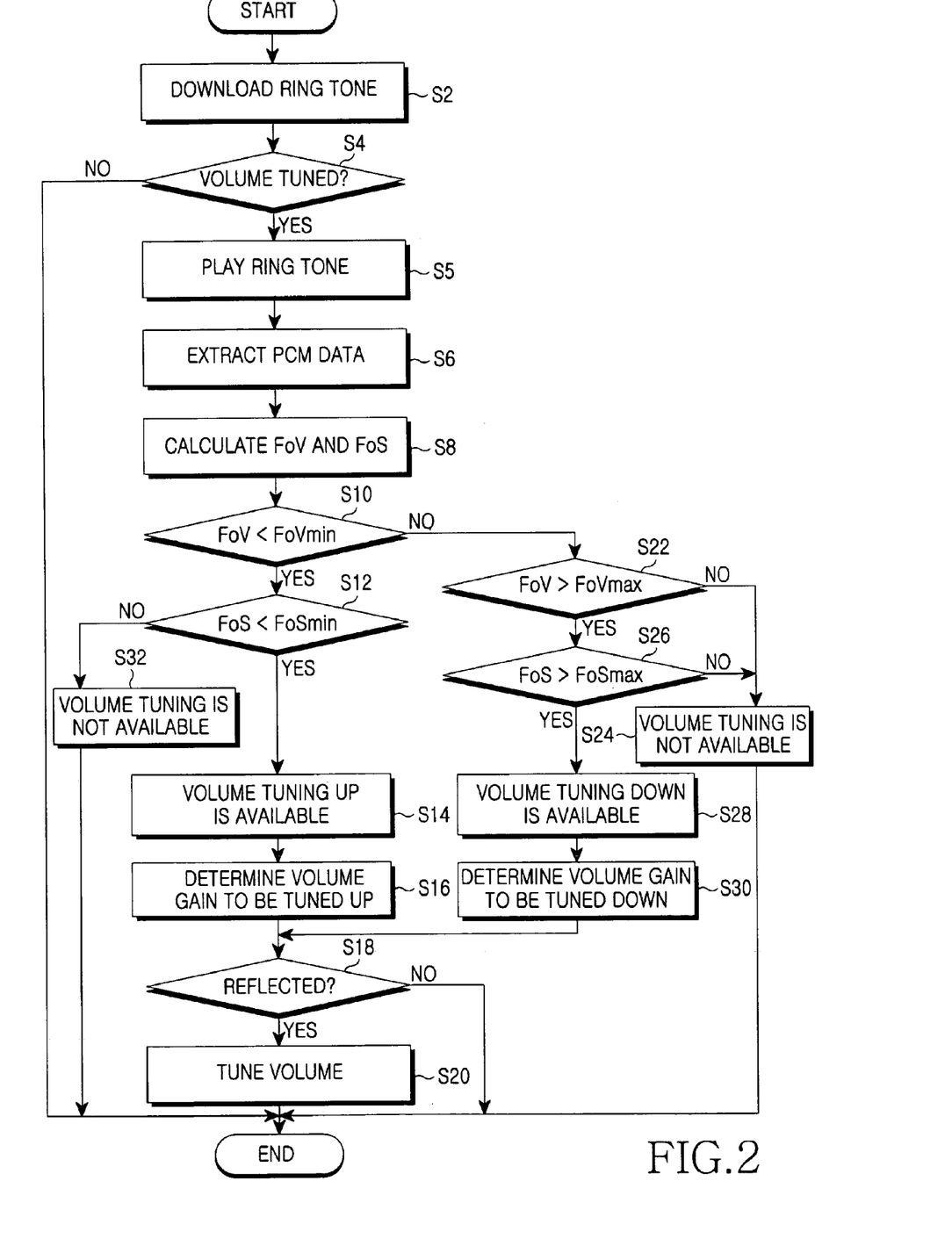
FIG. 2 is a flowchart illustrating a method for tuning the volume of a sound downloaded from an outside source according to the present invention.

FIG. 2 is a flowchart illustrating a method for tuning the volume of a sound downloaded from an outside source according to the present invention. Herein, a folder-type mobile phone including the apparatus shown in FIG. 1 will be taken as an example of a device for outputting a sound downloaded from an outside source through a speaker.

Once a new ring tone is downloaded into the mobile phone and stored in the memory 2 in step S2, the volume tuning determining unit 10 determines whether the user desires to tune the volume of the ring tone in step S4. In some cases, the subsequent process may be performed without the folder being closed.

Once the folder is closed, the volume tuning determining unit 10 retrieves the downloaded ring tone from the memory 2 and transmits the ring tone to the speaker 4 to play the ring tone in step S5. Once the microphone 6 to which the played ring tone is input transmits a sound signal to the codec 8, the codec 8 extracts PCM data from the sound signal and transmits the PCM data to the volume tuning determining unit 10 in step S6.

The volume tuning determining unit 10 obtains an FoV and an FoS of the speaker 4 using the PCM data of the ring tone. The volume tuning determining unit 10 compares the obtained FoV with an FoVmin and an FoVmax and the obtained FoS with an FoSmin and an FoSmax to determine whether to perform volume tuning and determine a volume adjustment gain (GainAdj). The FoVmin means a minimum sound volume of a ring tone to be played by the mobile phone and the FoVmax means a maximum sound volume of the ring tone. The FoSmin means a minimum stress ratio at which the volume can be tuned up without stressing the speaker of the mobile phone and the FoSmax means a maximum stress ratio at which the speaker cannot tolerate any more stress, i.e., the volume cannot be tuned up any more. It is preferable that the FoVmin, the FoVmax, the FoSmin, and the FoSmax are suitably set for a device characteristic of the mobile phone. For example, the FoVmin is an average of or the smallest value among smaller values among a plurality of measured FoVs and the FoVmax is an average of or the largest value among larger values among a plurality of measured FoVs. Similarly, the FoSmin is an average of or the smallest value among smaller values among a plurality of measured FoSs and the FoSmax is an average of or the largest value among larger values among a plurality of measured FoSs. In other words, to obtain the FoVmin, the FoVmax, the FoSmin, and the FoSmax, since the characteristic of the speaker is not easy to determine with a single ring tone, data regarding several ring tones is required. Thus, mobile phone manufacturers previously calculate the FoVmin, the FoVmax, the FoSmin, and the FoSmax using ring tones that are basically loaded in a mobile phone and set corresponding values in the volume tuning determining unit 10.

If the obtained FoV is less than the FoVmin, i.e., if it is determined that the volume is too low in step S10, the volume tuning determining unit 10 compares the obtained FoS with the FoSmin in step S12. If the obtained FoS is less than the FoSmin, i.e., if it is determined that the stress ratio of the speaker 4 is sufficiently small, the volume tuning determining unit 10 determines a volume adjustment gain (GainAdj) for the ring tone, i.e., a volume gain to be tuned up, within a range allowed by the stress ratio of the speaker 4. To this end, the volume tuning determining unit 10 first informs the user that volume tuning is available in step S14 and determines the volume gain to be tuned up in step S16 as follows in Equation (1).

$$\text{GainAdj}[dB] = 20 \times \log(\text{FoS min}/\text{FoS}) \quad (1),$$

where the volume adjustment gain (GainAdj) is a gain that is substantially required for volume tuning. For example, when FoSmin=1.8 and FoS=0.9, the volume is tuned by 6 [dB].

The volume tuning determining unit 10 determines whether the user desires to reflect the determined volume adjustment gain (GainAdj) in step S18, transmits the determined volume adjustment gain (GainAdj) and a corresponding ring tone of the memory 2 to the volume tuner 12 for volume tuning in step S20, and stores the volume-tuned ring tone in the memory 2.

If the FoV is not less than the FoVmin in step S10, the volume tuning determining unit 10 compares the FoV with the FoVmax in step S22. If the FoV is less than the FoVmin, it means that the volume of the ring tone is at an appropriate level. Thus, the user is informed in step S24 that volume tuning is not available and the entire process is terminated without volume tuning. However, this embodiment of the present invention can be modified such that the user tunes the volume based on the stress ratio of the speaker 4. In other words, steps S10 and S22 may be skipped. However, to keep the volume between the FoVmin and the FoVmax by controlling the stress ratio of the speaker 4, it is preferable that the FoVmin and the FoVmax are considered in steps S16 and S30 where the volume adjustment gain (GainAdj) is determined using the stress ratio of the speaker 4.

If the FoV is greater than the FoVmax in step S22, the volume tuning determining unit 10 determines that the volume is abnormally high and then compares the FoS with the FoSmax in step S26. If the FoS is greater than the FoSmax, i.e., if it is determined that the stress ratio of the speaker 4 is also abnormally large, having a negative influence upon the life span of the speaker 4, the volume tuning determining unit 10 determines to tune the volume down and informs the user of the determination in step S28. Herein, the volume adjustment gain (GainAdj), i.e., a volume gain to be tuned down, is determined in step S30 as follows in Equation (2).

$$\text{GainAdj}[dB] = 20 \times \log(\text{FoS max}/\text{FoS}) \quad (2)$$

The volume tuning determining unit 10 determines whether the user desires to reflect the determined volume adjustment gain (GainAdj) in step S18, transmits the determined volume adjustment gain (GainAdj) and a ring tone of the memory 2 to the volume tuner 12 for volume tuning in step S20, and stores the volume-tuned ring tone in the memory 2. If the FoS is not less than the FoSmin in step S12, since the volume of the ring tone is low, but gives stress to the speaker 4, volume tuning is not available in step S32. If the FoS is not greater than the FoSmax in step S26, since the volume of the ring tone is high, but does not give stress to the speaker 4, volume tuning is not available in step S24.

Hereinafter, calculation of the FoV and the FoS by the volume tuning determining unit 10 in step S8 will be described in more detail.

First, the FoV used for estimate the volume of a sound is measured as follows. A formal method for measuring the volume of a sound involves installing a sound level meter 1 m away from a mobile phone that plays a ring tone in an anechoic room and reading a measured value of the sound level meter when the ring tone is played by the mobile phone. In the present invention, the relative volume of a ring tone is estimated using an output of a microphone that is included in the mobile phone and outputs a value proportional to the volume of a sound.

Figure 3:
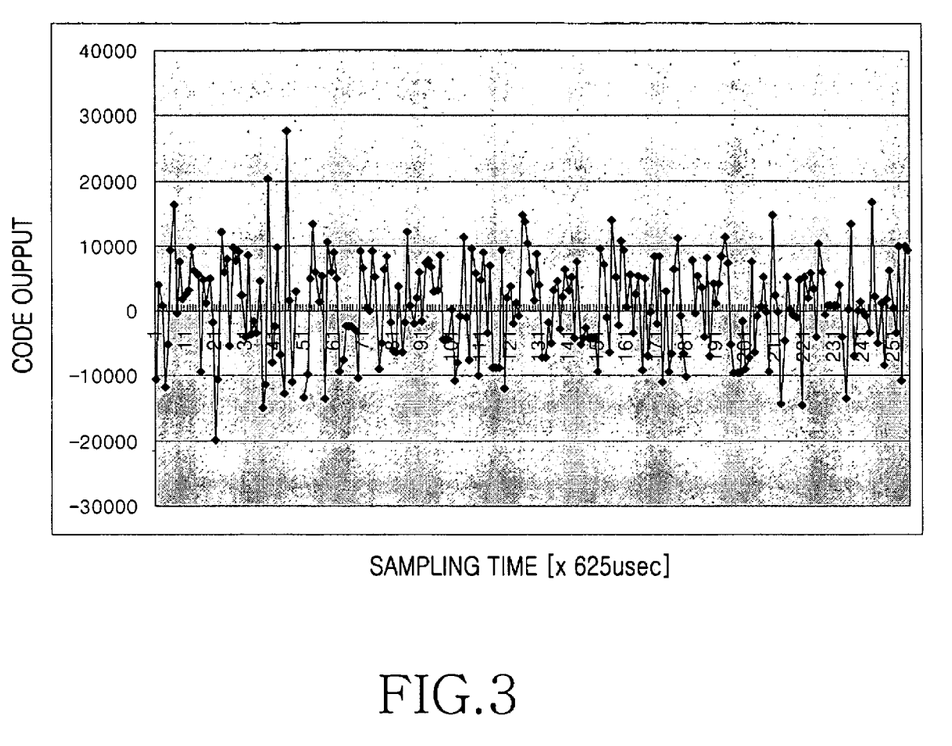
FIG. 3 illustrates an example of PCM data output from a codec according to the present invention.

FIG. 3 illustrates an example of PCM data of the codec 8 for a value corresponding to a voltage of a signal input to the microphone 6. For example, if the codec 8 can output 16 data every 10 msec (in other words, output 16 data/10 msec which is equal to an output of 1 data every 0.625 msec), the PCM data is sampled at 1.6 kHz and the codec 8 can sample a signal of up to 800 Hz according to a sampling theory.

To obtain the FoV, an average for a predetermined time duration is calculated using the PCM data shown in FIG. 3 as follows in Equation (3).

$$\text{FoV}[i] = (\text{FoV}[i-1] \times (N-1) + \text{CodecOutput}[i]^2)/N \quad (3),$$

where i represents an index indicating a time point at which a current FoV is measured, i−1 represents an index indicating a time point at which a previous FoV is measured, CodecOutput represents PCM data of the codec 8, and N is an integer. It is preferable that N is set experimentally. For example, according an experimental result with 45 ring tones loaded in a mobile phone, a most proper value of N is 64.

Figure 4:
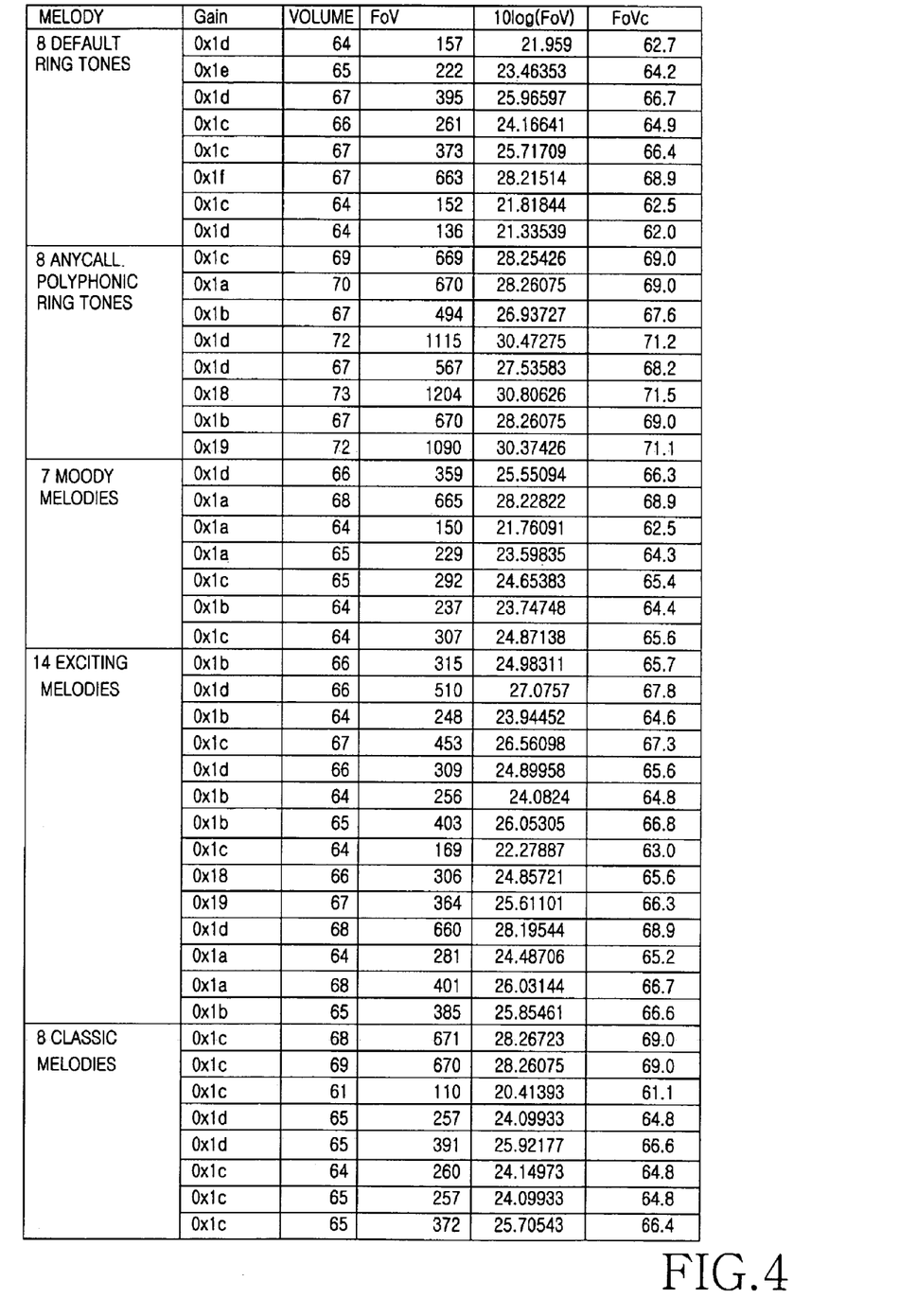
FIG. 4 is a graph showing a Figure of Volume (FoV) according to the present invention.
Figure 5:
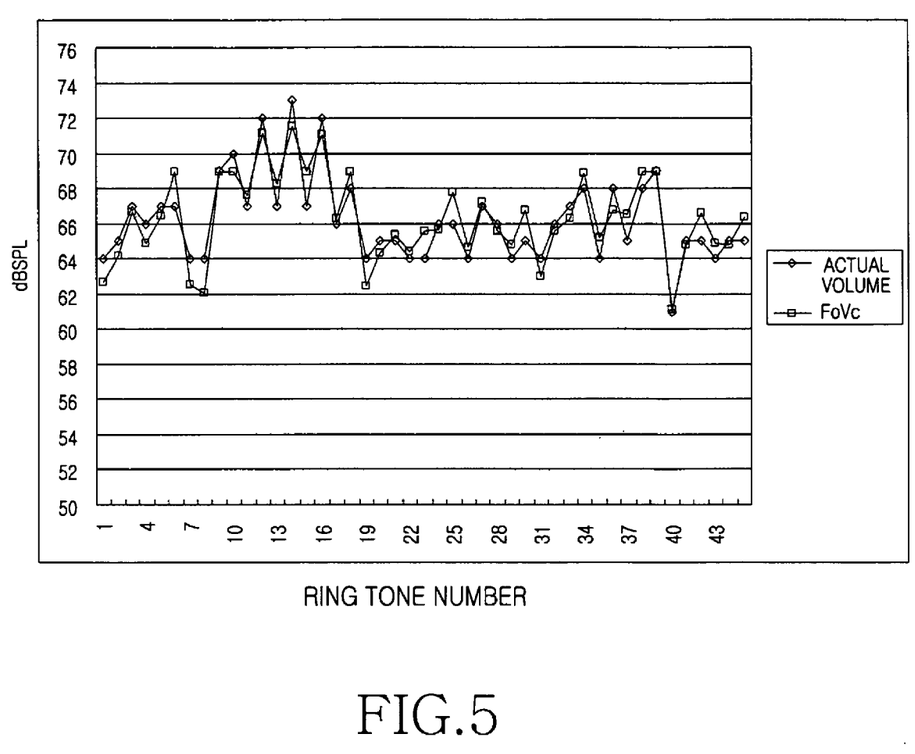
FIG. 5 is a graph showing a comparison between FoVs and actual volumes.

FoV[i] expressed by Equation (3) changes every minute and a final FoV is as follows, according to Equation (4).

$$\text{FoV} = \text{MAX}(\text{FoV}[i])/100000, i=1, 2, 3, \ldots, \text{MAXI} \quad (4),$$

where i=0–MAXI, MAXI represents an index indicating a time point at which the play of a ring tone is finished, and 100000 is a value for scaling-down and can be adjusted. FIGS. 4 and 5 show such calculation results.

Although the unit of a FoV is not shown in FIG. 4, the FoV is proportional to energy. To compare the FoV with the unit of an actual volume, i.e., dBSPL, the logarithm of the FoV is taken and is then multiplied by 10. An average of calculation results with respect to FoVs is indicated by FoVc. FIG. 5 is a graph showing a comparison between FoVcs and actual volumes. It can be seen from FIG. 5 that an FoVc and an actual volume are different by a maximum of about 2 dB.

Mobile phone manufacturers previously determine an FoVmin and an FoVmax using the measured FoV as follows. Referring to FIG. 4, for example, the FoVmin may be an average of FoVs corresponding to a relatively low volume of 64 dB among measured volumes of several ring tones and the FoVmax may be an average of FoVs corresponding to a relatively high volume of 70 dB among the measured volumes of the several ring tones.

The FoS used for estimate the stress ratio of the speaker 4 is measured as follows. Since the stress ratio of the speaker 4 is measured at an input end of the speaker 4 and PCM data of a signal input to the microphone 6 is used to measure the FoS, the speaker 4, the main body of a device, and the microphone 6 should be considered.

Figure 6:
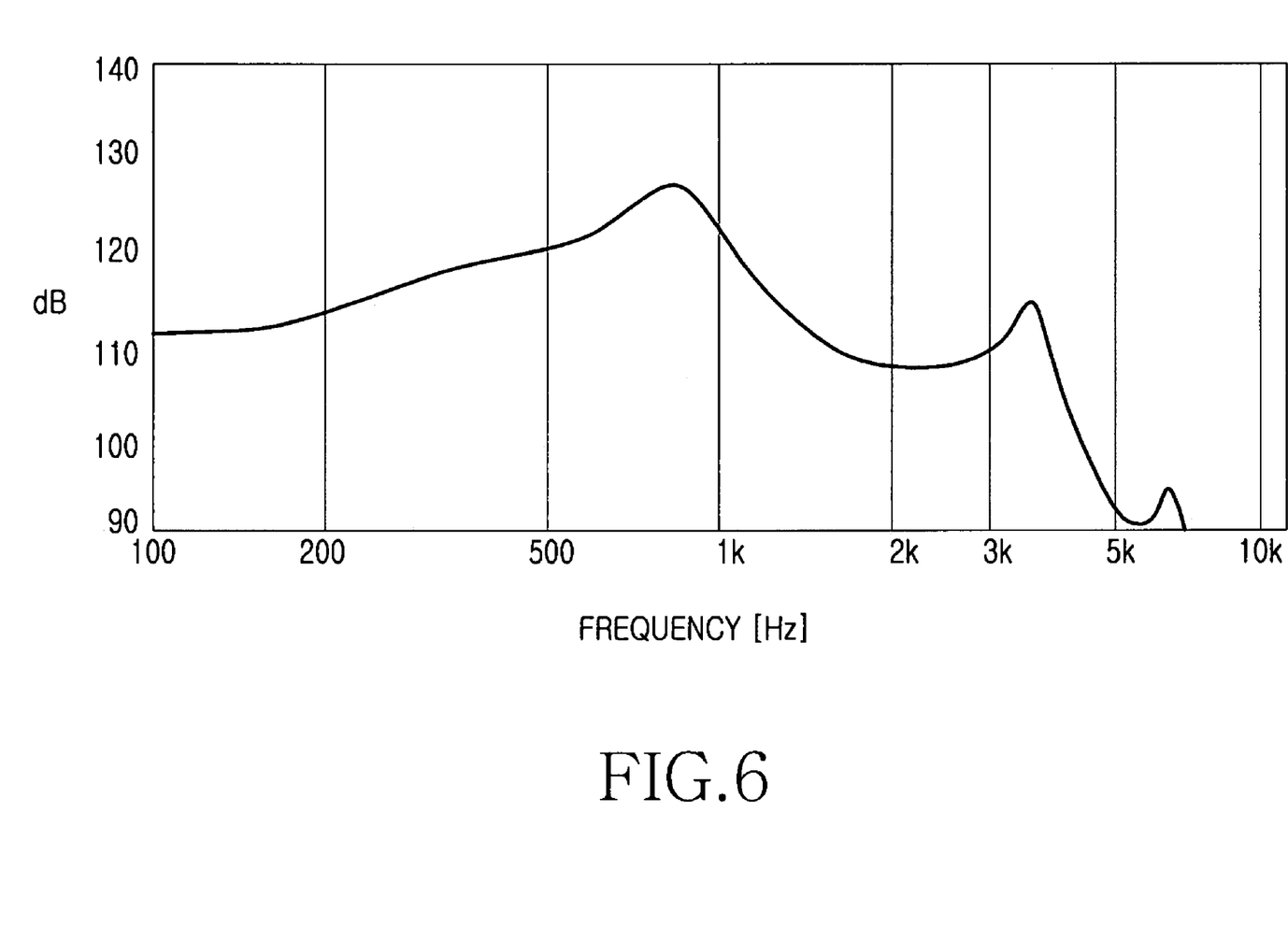

FIG. 6 is a graph showing the frequency characteristic of the speaker 4. When the volume of a ring tone is highest, if the stress ratio of the speaker 4 is largest, it is supposed that the volume and the stress ratio of the speaker 4 have a linear relationship, but the actual relationship between them is different from such a supposition. This is because since the size of the mobile phone is small, the size of the speaker 4 is also small and the resonating frequency of the speaker 4 is 600-800 Hz. In addition, quiet music or music whose low-pitched sound is loud has the largest stress ratio at a frequency that is much lower than the resonating frequency. Thus, to calculate the stress ratio of the speaker 4, the frequency characteristic of the speaker 4 should be considered. Thus, a frequency component is first extracted from the PCM data of the codec 8, according to Equation (5).

$$W_N(i) = \begin{cases} 1, & \text{if } i \leq N/2 \\ -1, & \text{otherwise} \end{cases}, i = 1, \ldots, N \quad (5)$$

For example, if it is assumed that $W_8$ is $\{1, 1, 1, 1, -1, -1, -1, -1\}$ and the shortest sampling interval of the codec 8 is 1.6 kHz, $W_8$ is a square wave of 200 Hz.

By multiplying the window function of Equation (5) by CodecOutput that is the PCM data of the codec 8, a frequency component $F_N$ of a ring tone can be extracted as follows, according to Equation (6).

$$F_N = \sum_{i=1}^{MAX(N)} CodecOutput(i) \times W_N[i\%N], N = 2, 4, \ldots, 32, \quad (6)$$

where i%N is a remainder after division of i by N and the maximum value of N is 32 because 50 Hz which is relatively low among human voice frequencies, is sufficient for the extraction of the frequency component $F_N$. The maximum value of N may be adjusted.

To calculate the frequency component $F_N$ using Equation (6), each sampled data should be divided into 32 segments. However, since a time point at which peak stress is generated may not be included in a sector corresponding to the 32 segments but may be distributed over two sectors, the frequency component $F_N$ may be calculated as follows, according to Equation (7).

$$F_N[i]=(F_N[i-1] \times (N_S-1)+CodecOutput(i) \times W_N[i\%N])/N_S \quad (7)$$

According to Equation (7), since an average of frequency components extracted from the output of the codec 8 with respect to time can be obtained, the frequency component $F_N$ of a ring tone can be obtained in real time. In Equation (7), $N_S$ is also set experimentally, and is assumed herein to be 32.

Figure 7:
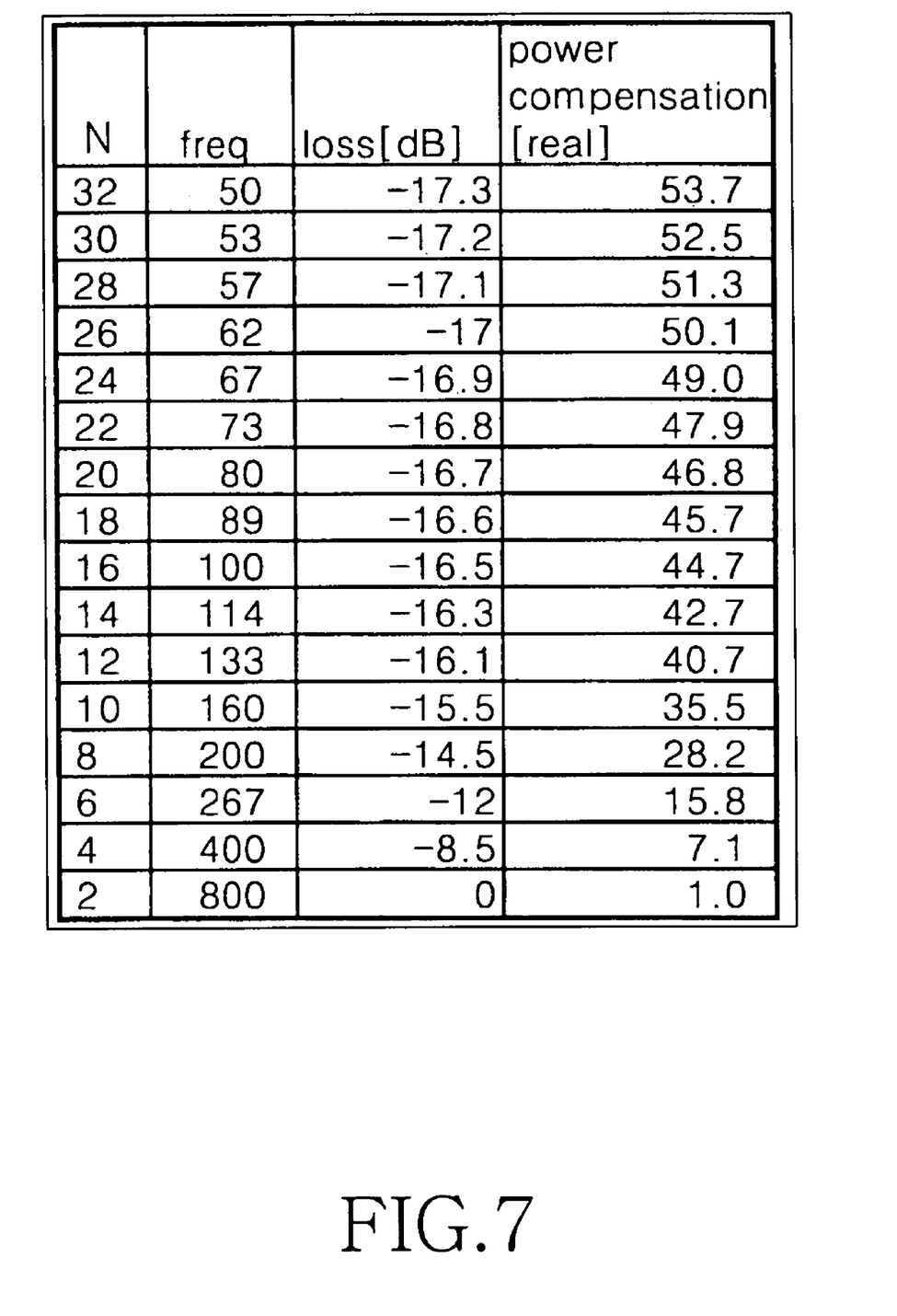
FIG. 7 is a table showing an analysis of the graph shown in FIG. 6.

To calculate the FoS used to estimate the stress ratio of the speaker 4 from the frequency component calculated using Equation (7), it is desirable to consider the frequency characteristic of the speaker 4. FIG. 7 is a table showing an analysis of the graph shown in FIG. 6.

In FIG. 7, for example, since a frequency component corresponding to $F_{32}$ is input to the microphone 6 after its frequency changes into a value that is less than a peak frequency component by 17.3 dB, a power compensation of 53.7 should be provided in order for a signal to be estimated at the input end of the speaker 4. Thus, the FoS at the time point i is given by Equation (8) and the power compensation of FIG. 7 corresponds to Weight[N].

$$FoS[i] = \sum_{N=2,4,\ldots}^{32} F_N[i] \times F_N[i] \times \text{Weight}[N] \quad (8)$$

Figure 8:
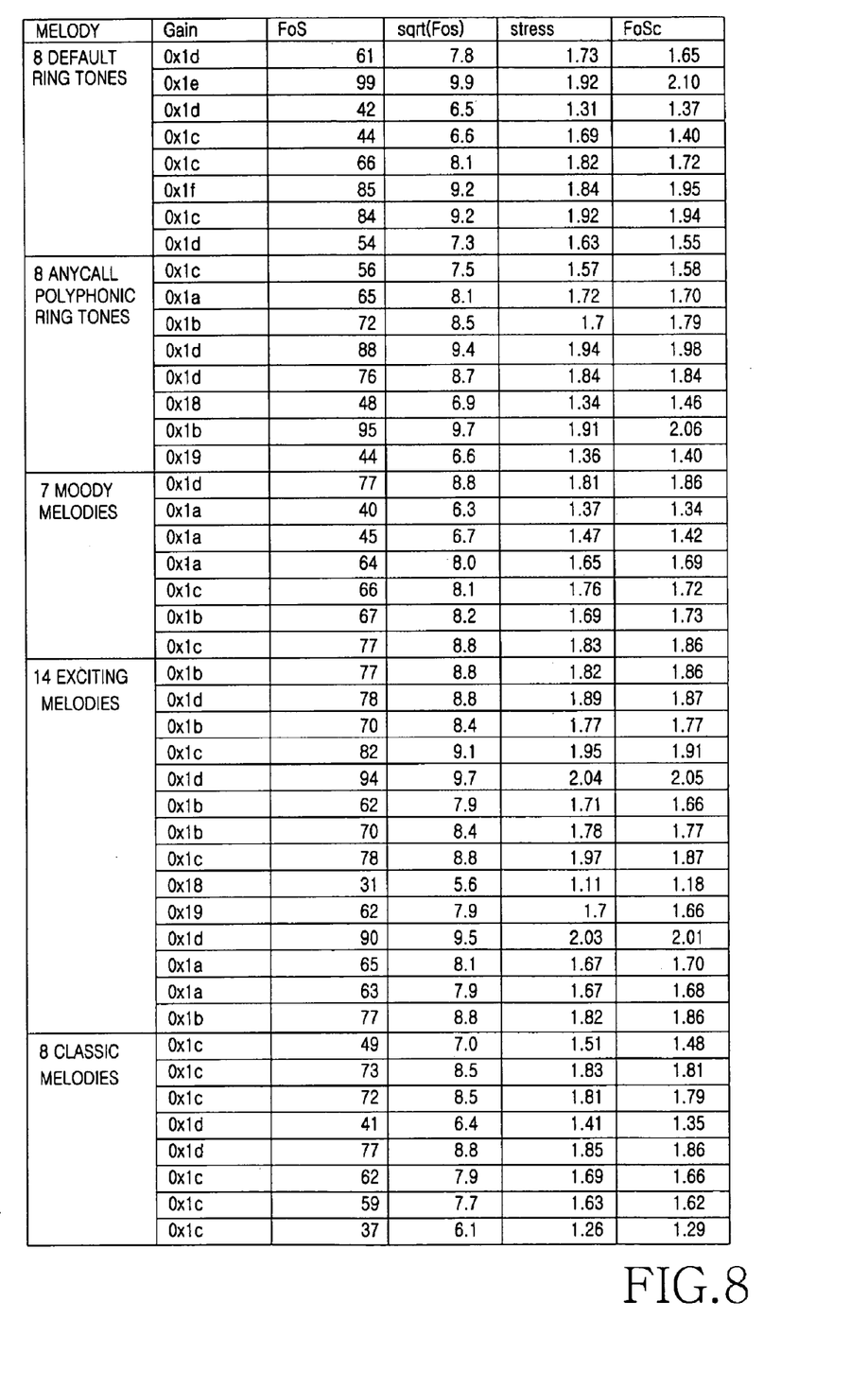
FIG. 8 is a table showing a Figure of Stress (FoS) of the speaker according to the present invention.
Figure 9:
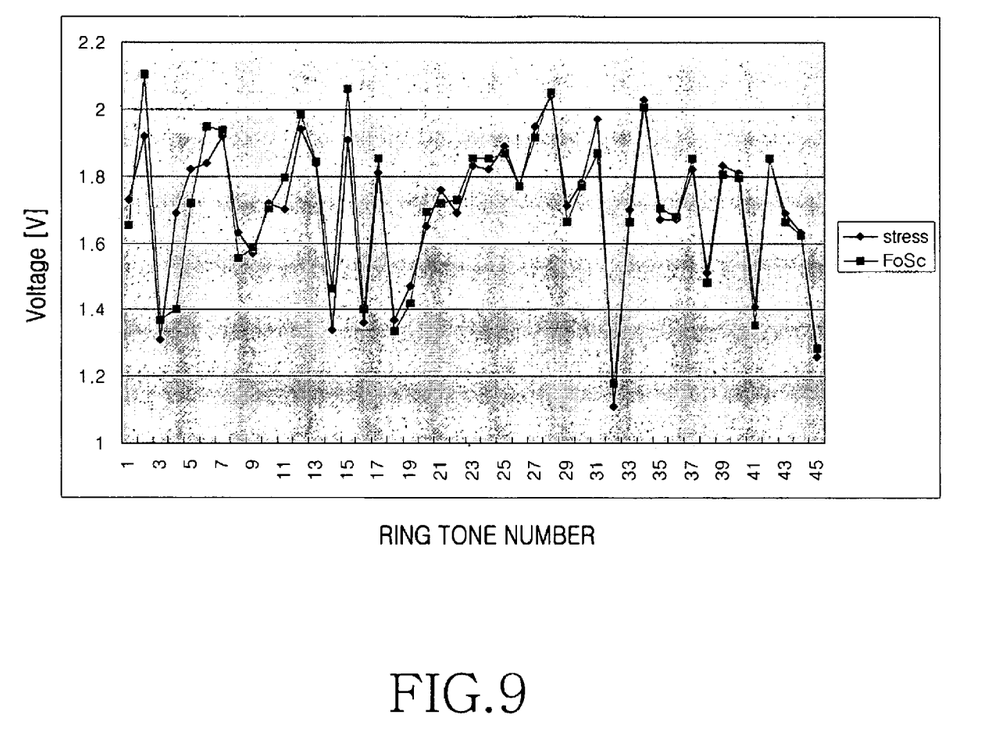
FIG. 9 is a graph showing a comparison between FoSs and actual stress ratios of the speaker.

Since Equation (8) changes over time, a final FoS is as follows in Equation (9).

$$FoS=MAX(FoS[i])/10000, i=0-MAXI \quad (9),$$

where MAXI represents an index indicating a time point at which the play of a ring tone is finished. FIGS. 8 and 9 show measurement results. In FIG. 8, the FoS is proportional to energy. To compare the FoS with the actual stress of the speaker 4, the square root of the FoS is taken and is then scaled down. Thus, an FoSc is obtained. FIG. 9 is a graph showing a comparison between the FoScs and actual stress ratios of the speaker 4. It can be seen from FIG. 9 that an FoSc and an actual stress ratio of the speaker 4 are different by a maximum of about 0.2.

Mobile phone manufacturers previously determine the FoSmin and the FoSmax using the measured FoS as follows. For example, referring to FIG. 8, when it is assumed that a minimum stress ratio at which the volume can be tuned up is 1.7, the FoSmin may be set to 65 having an FoSc of 1.70 among FoSs of various ring tones. In addition, when a stress ratio is 2.1, the FoSmax may be set to 99 having an FoSc of 2.10 among FoSs of various ring tones to prevent the volume from being tuned up any more. Herein, it is preferable that the FoSmin and the FoSmax are determined empirically and experimentally and may be changed.

As described above, by tuning the volume of a sound downloaded from an outside source, a high quality sound can be provided to a user. In addition, by tuning the volume of a sound using the stress ratio of a speaker, the life span of the speaker can be lengthened.

While the invention has been shown and described with reference to a certain preferred embodiment thereof, it will be understood by those skilled in the art that various changes in form and details may be made therein without departing from the spirit and scope of the invention.

What is claimed is:

1. An apparatus for tuning a volume of a sound signal downloaded from an outside source, the apparatus comprising:
 a memory for storing the sound signal downloaded from the outside source;
 a speaker for outputting the sound signal stored in the memory;
 a microphone for receiving the sound signal output from the speaker;
 a codec for outputting modulation data of the sound signal input from the microphone;
 a volume tuning determining unit for calculating volume figure data with respect to the sound signal and stress figure data of the speaker, using the modulation data, and for calculating volume adjustment gain data when the volume figure data is less than a predetermined volume figure minimum and the stress figure data is less than a predetermined stress figure minimum or when the volume figure data is greater than a predetermined volume figure maximum and the stress figure data is greater than a predetermined stress figure maximum; and
 a volume tuner for tuning the volume of the sound signal using the calculated volume adjustment gain data.

2. The apparatus of claim 1, wherein the volume tuning determining unit stores the volume-tuned sound signal in the memory.

3. The apparatus of claim 1, wherein the volume tuning determining unit calculates the volume adjustment gain data within a predetermined range of a stress ratio of the speaker.

4. A method for tuning the volume of a sound signal downloaded from an outside source in a device having a speaker that outputs the sound signal and a microphone, the method comprising:
 receiving the sound signal output from the speaker through the microphone;
 outputting modulation data of the sound signal input from the microphone;
 calculating volume figure data with respect to the sound signal received through the microphone and stress figure data of the speaker using the modulation data;
 calculating volume adjustment gain data for the sound signal when the volume figure data is less than a predetermined volume figure minimum and the stress figure data is less than a predetermined stress figure minimum or when the volume figure data is greater than a predetermined volume figure maximum and the stress figure data is greater than a predetermined stress figure maximum; and
 tuning the volume of the sound signal using the calculated volume adjustment gain data.

5. The method of claim 4, wherein the step of calculating the volume adjustment gain comprises:
 calculating a volume gain to be tuned up when the volume figure data is less than the predetermined volume figure minimum and the stress figure data is less than the predetermined stress figure minimum; and
 calculating a volume gain to be tuned down when the volume figure data is greater than the predetermined volume figure maximum and the stress figure data is greater than the predetermined volume figure maximum.

6. The method of claim 4, wherein the step of calculating the volume adjustment gain data comprises:
 calculating a volume gain to be tuned up using the stress figure data and the predetermined stress figure minimum; and
 calculating a volume gain to be tuned down using the stress figure data and the predetermined stress figure maximum.

7. The method of claim 4, wherein the step of calculating the volume figure data with respect to the sound signal and the stress figure data of the speaker comprises creating modulation data from the sound signal received through the microphone.

8. The method of claim 4, wherein the volume adjustment gain data is calculated within a predetermined range in which a stress ratio of the speaker does not fall beyond the predetermined stress figure minimum and the predetermined stress figure maximum.

* * * * *